US011587888B2

(12) United States Patent
Sahin et al.

(10) Patent No.: US 11,587,888 B2
(45) Date of Patent: Feb. 21, 2023

(54) MOISTURE SEAL FOR PHOTONIC DEVICES

(71) Applicant: GLOBALFOUNDRIES U.S. INC., Santa Clara, CA (US)

(72) Inventors: Asli Sahin, Danbury, CT (US); Thomas F. Houghton, Marlboro, NY (US); Jennifer A. Oakley, Cohoes, NY (US); Jeremy S. Alderman, New Rochelle, NY (US); Karen A. Nummy, Newburgh, NY (US); Zhuojie Wu, Port Chester, NY (US)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 467 days.

(21) Appl. No.: 16/713,709

(22) Filed: Dec. 13, 2019

(65) Prior Publication Data

US 2021/0183791 A1 Jun. 17, 2021

(51) Int. Cl.

| | |
|---|---|
| ***G02B 6/42*** | (2006.01) |
| ***H01L 23/00*** | (2006.01) |
| *G02B 6/12* | (2006.01) |

(52) U.S. Cl.

CPC .......... *H01L 23/564* (2013.01); *G02B 6/4243* (2013.01); *G02B 6/4248* (2013.01); *G02B 6/4251* (2013.01); *H01L 23/562* (2013.01); *G02B 6/12* (2013.01); *G02B 2006/12061* (2013.01)

(58) Field of Classification Search

CPC ... H01L 23/564; H01L 23/562; G02B 6/4243; G02B 6/4248; G02B 6/4251; G02B 6/12; G02B 2006/12061

USPC .......................................................... 385/94

See application file for complete search history.

(56) References Cited

U.S. PATENT DOCUMENTS

| | | | | |
|---|---|---|---|---|
| 6,383,893 | B1 | 5/2002 | Begle et al. | |
| 6,825,132 | B1 * | 11/2004 | Inoue | H01L 21/76829 438/782 |
| 2011/0284953 | A1 * | 11/2011 | Long | H01L 29/861 257/E21.409 |
| 2012/0161255 | A1 | 6/2012 | Gabert et al. | |
| 2015/0069608 | A1 | 3/2015 | Collins et al. | |
| 2020/0135662 | A1 * | 4/2020 | Iruvanti | H01L 23/564 |

OTHER PUBLICATIONS

Ken Giewont et al.,"300-mm Monolithic Silicon Photonics Foundry Technology",IEEE Journal of Selected Topics in Quantum Electronics, vol. 25, No. 5, Sep./Oct. 2019, 11 pages.

* cited by examiner

*Primary Examiner* — Jerry M Blevins

(74) *Attorney, Agent, or Firm* — Anthony Canale; Andrew M. Calderon; Calderon, Safran & Cole, P.C.

(57) ABSTRACT

The present disclosure relates to semiconductor structures and, more particularly, to a moisture seal for photonic devices and methods of manufacture. The structure includes: a first trench in at least one substrate material; a guard ring structure with an opening and which at least partially surrounds the first trench; and a second trench at a dicing edge of the substrate, the second trench being lined on sidewalls with barrier material and spacer material over the barrier material.

18 Claims, 6 Drawing Sheets

5
30
35
35
25
20
15
40
10

MOISTURE SEAL FOR PHOTONIC DEVICES

FIELD OF THE INVENTION

The present disclosure relates to semiconductor structures and, more particularly, to a moisture seal for photonic devices and methods of manufacture.

BACKGROUND

Complementary metal-oxide semiconductor (CMOS) devices have a continuous metal guard ring. In photonic devices, though, a trench or groove is provided to accommodate a fiber optic extending to a waveguide structure. This trench will effectively break or cut the guard ring. That is, in photonics applications, a break in the guard ring is needed for the fiber optic to pass through from a chip edge to a CMOS region.

In a photonics application, the trench is provided through a back end of line (BEOL) stack. In an attempt to prevent moisture ingress, the trench is filled with tetraethyl orthosilicate (TEOS) which is low density and semi-porous. The TEOS, though, allows moisture to enter into the active area, e.g., move into low-k layers through a break in the guard ring. This moisture can cause early voltage breakdown of the BEOL metal lines on diced chips after V-groove processing.

SUMMARY

In an aspect of the disclosure, a structure comprises: a first trench in at least one substrate material; a guard ring structure with an opening and which at least partially surrounds the first trench; and a second trench at a dicing edge of the substrate, the second trench being lined on sidewalls with barrier material and spacer material over the barrier material.

In an aspect of the disclosure, a structure comprises: a groove formed within one or more layers of material and which extends from a perimeter of a chip; a trench around the perimeter of a chip; at least a first moisture barrier material lining sidewalls of the trench; and a spacer material lining the first moisture barrier material; and a material filling remaining portions of the trench, and which is directly in contact with the spacer material.

In an aspect of the disclosure, a method comprises: forming a first trench in at least one substrate material; forming a guard ring structure with an opening and which at least partially surrounds the first trench; and forming a second trench at a dicing edge of the substrate, the second trench being lined on sidewalls with a barrier material and a spacer material over the barrier material.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a moisture seal for photonic devices and methods of manufacture. More specifically, the present disclosure is directed to an integrated CMOS with a silicon-photonics chip which includes a back end of line (BEOL) and a passive fiber alignment with a moisture seal. Advantageously, the integrated CMOS with the silicon-photonics chip includes a self-aligned moisture barrier spacer to protect copper BEOL structures from moisture ingress.

In photonic devices, as the current and voltage increases, there is an increased fail potential (i.e., early breakdown voltage) due to moisture ingress from a chip sidewall. In the present disclosure, though, a barrier (i.e., moisture seal) prevents moisture ingress into the BEOL low-k dielectric materials even as the current and voltage increases. For example, by implementing the moisture seal at an edge of the chip it has been found through test that there is no moisture ingress up to 1000 hours of high temperature humidity stress at a high current and voltage potential.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the semiconductor structure of the present disclosure have been adopted from integrated circuit (IC) technology. For example, the structures are built on wafers and are realized in films of material patterned by photolithographic processes on the top of a wafer. In particular, the fabrication of the structures uses three basic building blocks: (i) deposition of thin films of material on a substrate, (ii) applying a patterned mask on top of the films by photolithographic imaging, and (iii) etching the films selectively to the mask.

Figure 1:
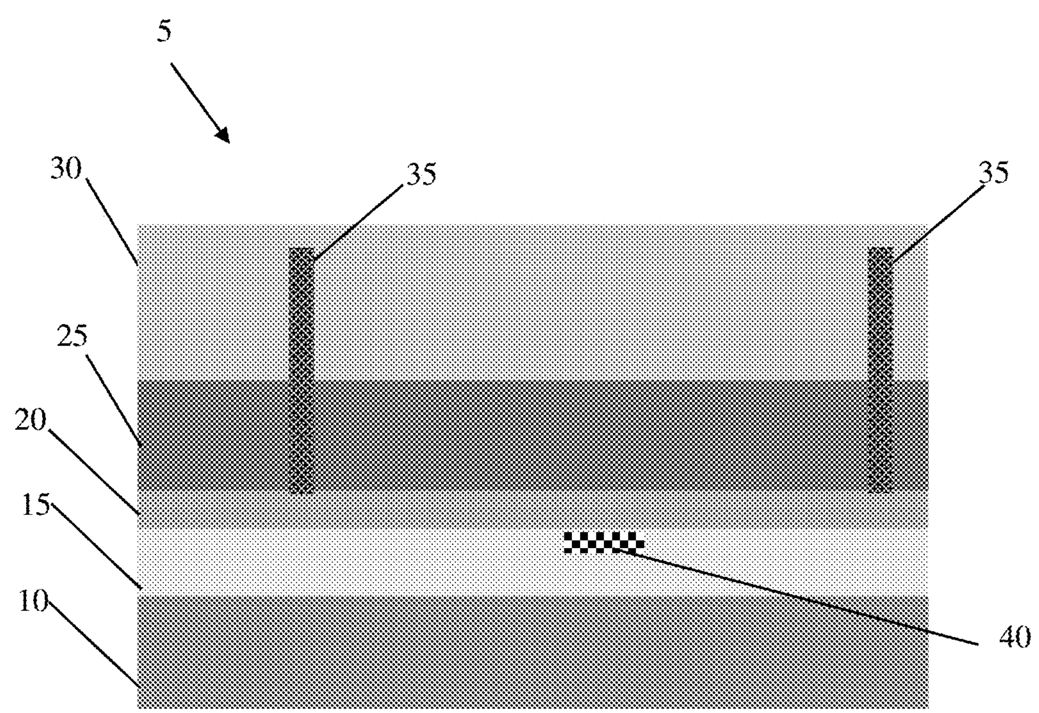
FIG. 1 shows a cross-section of a base structure and respective fabrication processes in accordance with aspects of the present disclosure.

FIG. 1 shows a base structure and respective fabrication processes in accordance with aspects of the present disclosure. More specifically, the structure 5 of FIG. 1 includes a semiconductor material 10. In embodiments, the semiconductor material 10 can be composed of, e.g., Si, Sapphire, SiC or glass. The semiconductor material 10 can be a bulk wafer with an oxide layer 15 deposited thereon. The oxide layer 15 can be representative of a buried oxide (BOX) layer used in semiconductor on insulator (SOI) technologies. In embodiments, the oxide layer 15 can be a 2 μm thermal BOX layer; although other dimensions are also contemplated herein.

A waveguide structure 40 can be formed in or on the oxide layer 15. In embodiments, the waveguide structure 40 can be a semiconductor material (e.g., silicon) formed on the oxide layer 15, which is part of the SOI technology. In further embodiments, the waveguide structure can be SiGe or other known semiconductor materials used in photonics applications as is known in the art such that no further explanation is required for a complete understanding of the present disclosure.

Still referring to FIG. 1, the waveguide structure 40 can be formed using conventional lithography and etching processes, e.g., a RIE process. For example, a resist formed over the semiconductor material is exposed to energy (light) to form a pattern (opening). An etching process with a selective chemistry, e.g., reactive ion etching (RIE), will be used to pattern the semiconductor material. The resist can then be removed by a conventional oxygen ashing process, $H_2N_2$ ashing process or other known stripants. In embodiments, additional oxide material can then be deposited over the waveguide structure 40.

Still referring to FIG. 1, a contact layer 20 is deposited on the oxide layer 15. In embodiments, the contact layer 20 can be a nitride material. A low-k dielectric material 25 is deposited on the contact layer 20, followed by deposition of an insulator material 30, e.g., oxide or nitride, deposited on the low-k dielectric material 25. In embodiments, the low-k dielectric material 25 and the material 30 can be included in a back end of the line (BEOL) stack. In embodiments, the contact layer 20, the low-k dielectric material 25, and the material 30 can be deposited using conventional deposition methods including, e.g., chemical vapor deposition (CVD).

A guard ring 35 is formed through the low-k dielectric layer 25 and the oxide or nitride material 30. The guard ring 35 can be a metal feature that extends about an active region of the chip including the waveguide structure 40. In embodiments, the guard ring 35 can be formed by using conventional lithography and etching processes, e.g., a RIE processes as already described herein, followed by deposition and chemical mechanical polishing processes to remove any excess material from a surface of the material 30. In embodiments, the guard ring 35 can be composed of any metal material, for example.

Figure 2A:
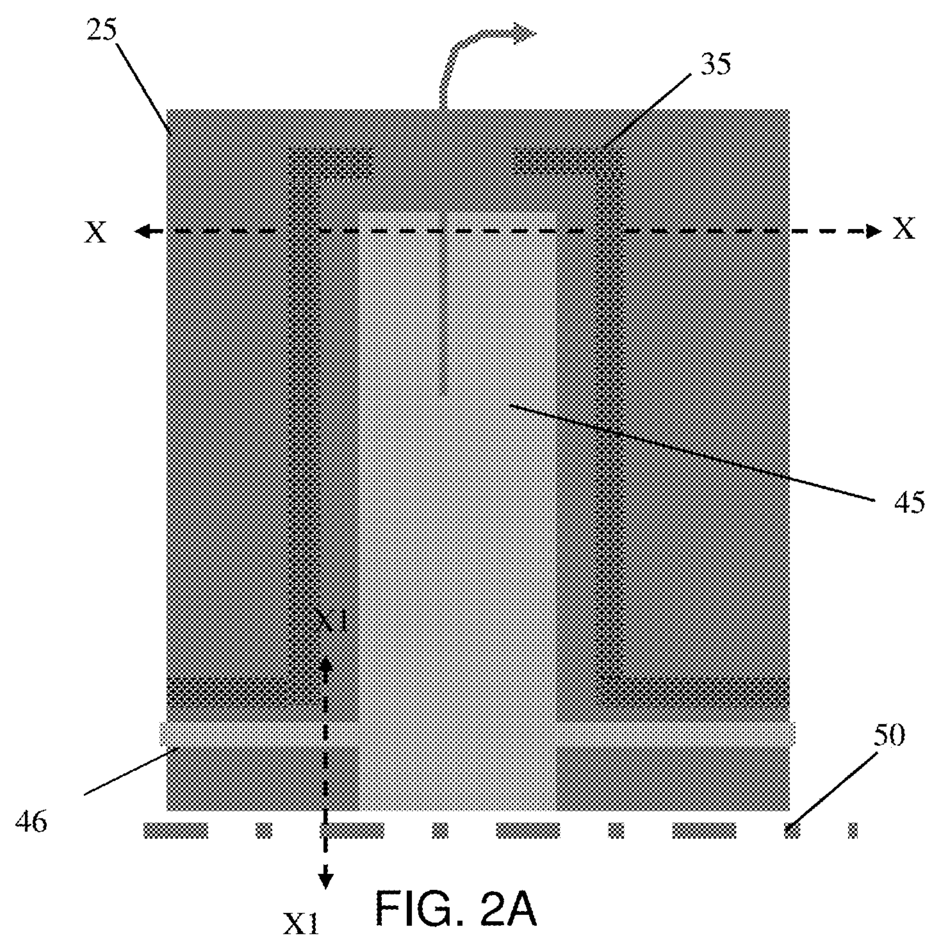
FIG. 2A shows a trench in the base structure, amongst other features, and respective fabrication processes in accordance with aspects of the present disclosure.
Figure 2B:
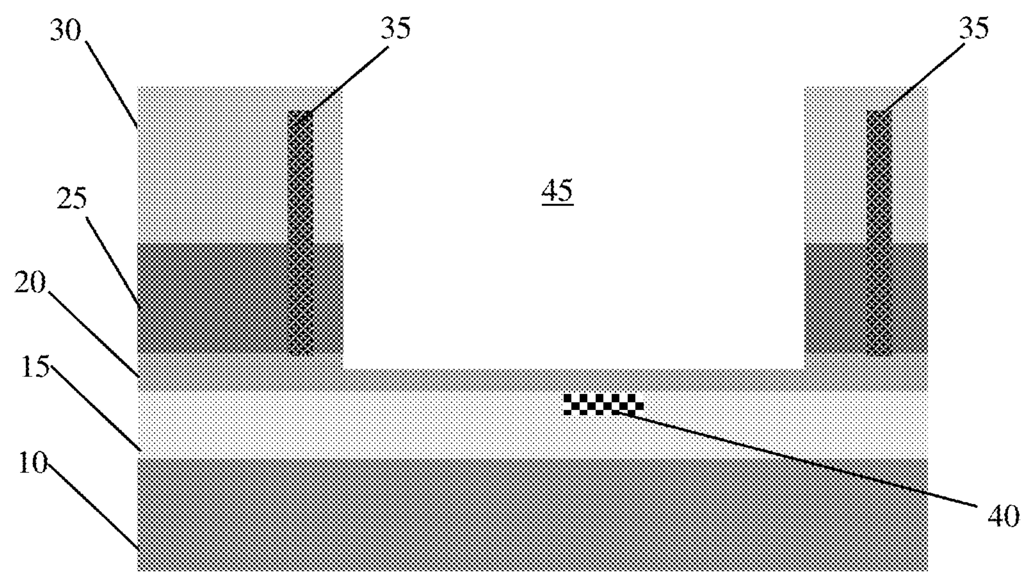
FIG. 2B shows a cross-sectional view of FIG. 2A along line X-X.
Figure 2C:
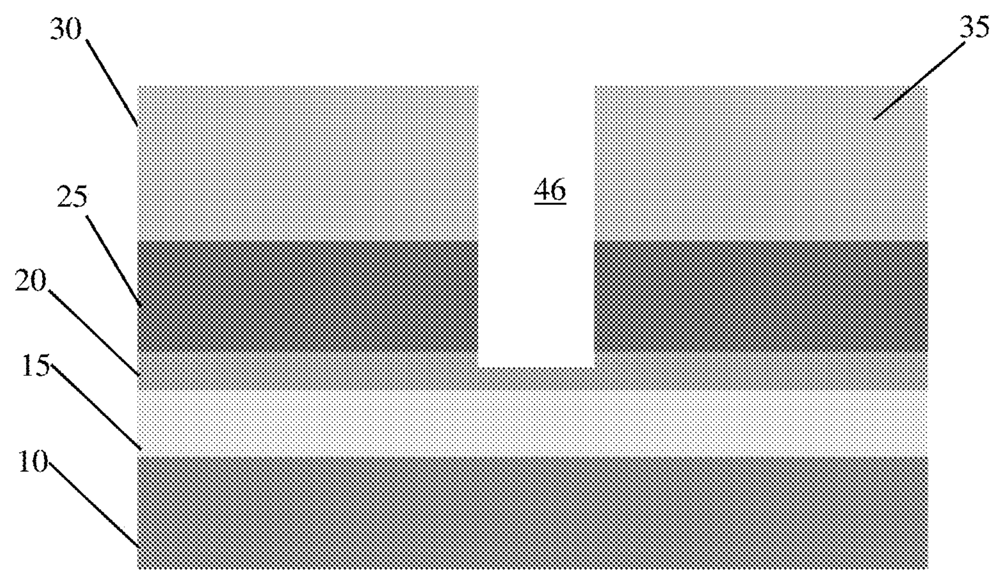
FIG. 2C shows a cross-sectional view of FIG. 2A along line X1-X1.

FIG. 2A shows a top view of trenches in the base structure, amongst other features, and respective fabrication processes in accordance with aspects of the present disclosure. FIG. 2B shows a cross-sectional view of FIG. 2A along line X-X and FIG. 2B shows a cross-sectional view of FIG. 2A along line X1-X1. More specifically, FIGS. 2A-2C show a trench 45 and opening in the guard ring 35, in addition to a trench 46 formed around a perimeter of the chip along a dicing edge 50.

In embodiments, the trench 46 has a smaller cross sectional area (e.g., width) than the trench 45. In addition, the trench 46 will intersect with the trench 45 at the dicing edge 50. Moreover, the trench 45 will extend to the edge of the chip, e.g., substrate, which allows for the accommodation of the fiber optic through the opening of the guard ring 35. To form the trenches 45, 46, an etching process with a selective chemistry, e.g., RIE, is performed through the low-k dielectric materials 25 and the material 30. In embodiments, the trenches 45, 46 can extend partially within the material 20, with the trench 45 aligned over the waveguide structure 40. The trench 45 will be used as, e.g., a V-groove, which will accommodate a fiber optic leading into an active area of the chip. Please note that the trench 45 (e.g., V-groove) is not limited to a vertical sidewall and can have a slanted or V-groove profile.

Figure 3A:
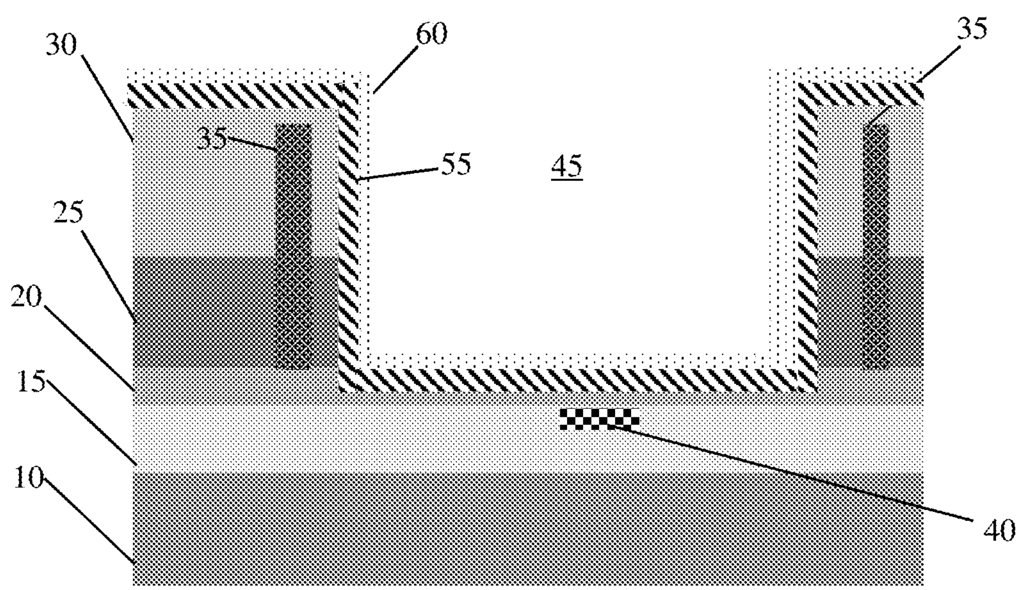
FIGS. 3A and 3B show cross-sectional views of a barrier material and spacer material within the trenches, amongst other features and respective fabrication processes in accordance with aspects of the present disclosure.
Figure 3B:
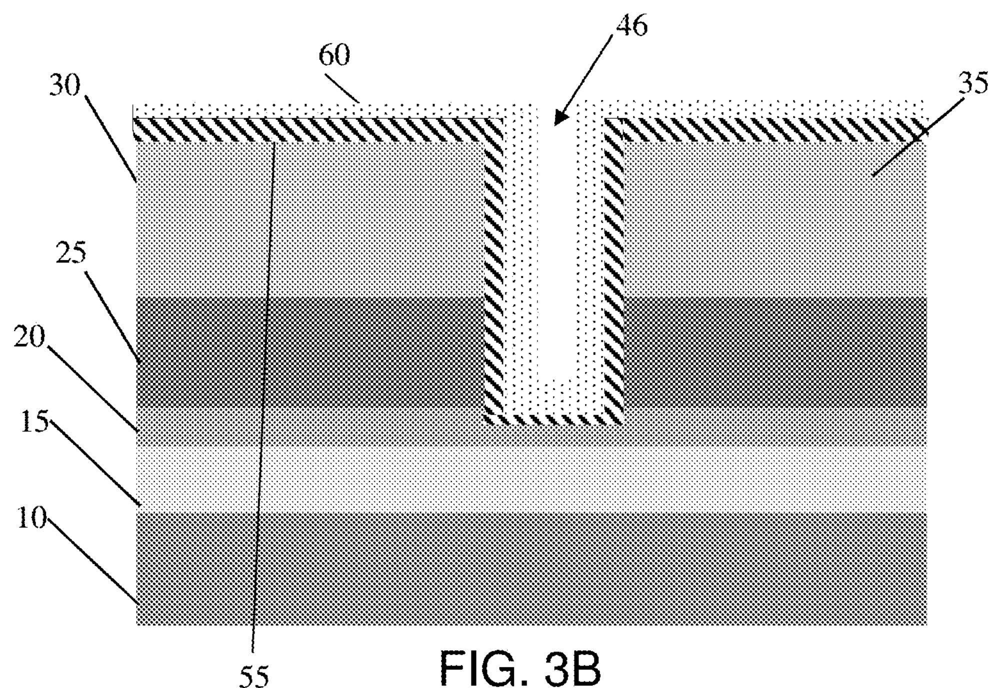

FIGS. 3A and 3B show a barrier material and spacer material within the trenches, amongst other features and respective fabrication processes in accordance with aspects of the present disclosure. More specifically, a barrier material 55 is deposited within the trenches 45, 46 and on a surface of the material 30. The barrier material 55 can be deposited by an atomic layer deposition (ALD) process, a chemical vapor deposition (CVD) process, a plasma-enhanced chemical vapor deposition (PECVD) process, or other conventional deposition process. In embodiments, the barrier material 55 can include alumina, oxide, nitride, or any other moisture barrier material that has selective etching to the waveguide structure 40 or the oxide layer 15. In an embodiment, the barrier material 55 can include nitride having a thickness of approximately 500 Å+-3% thickness; although other dimensions are contemplated herein which will not pinch off the opening of the trench 46. A spacer 60 is deposited over the barrier material 55. In embodiments, the spacer 60 can be an oxide, such as a tetraethyl orthosilicate (TEOS) oxide.

Figure 4A:
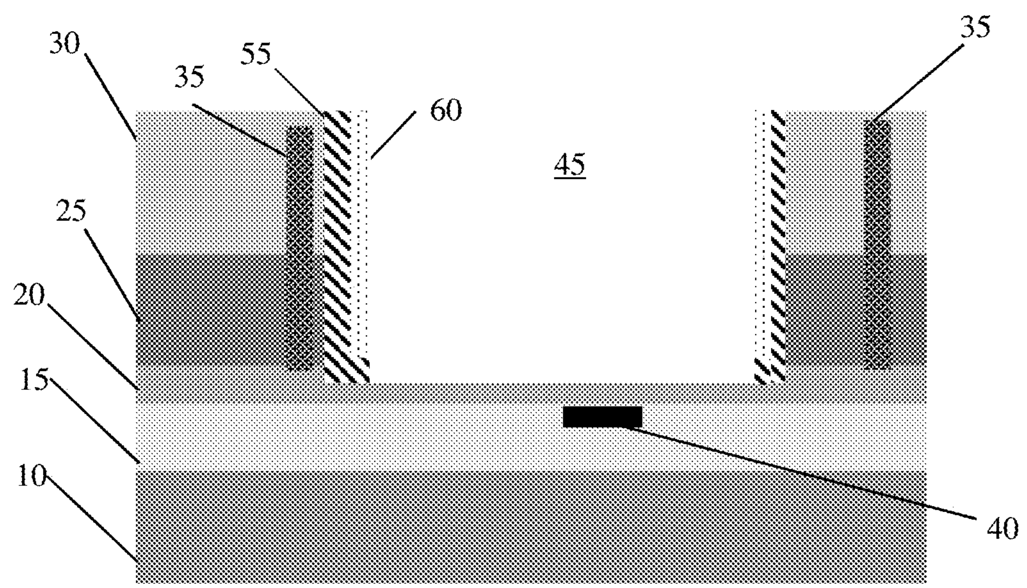
FIGS. 4A and 4B show cross-sectional views of a partial spacer etch for stack removal, amongst other features, and respective fabrication processes in accordance with aspects of the present disclosure.
Figure 4B:
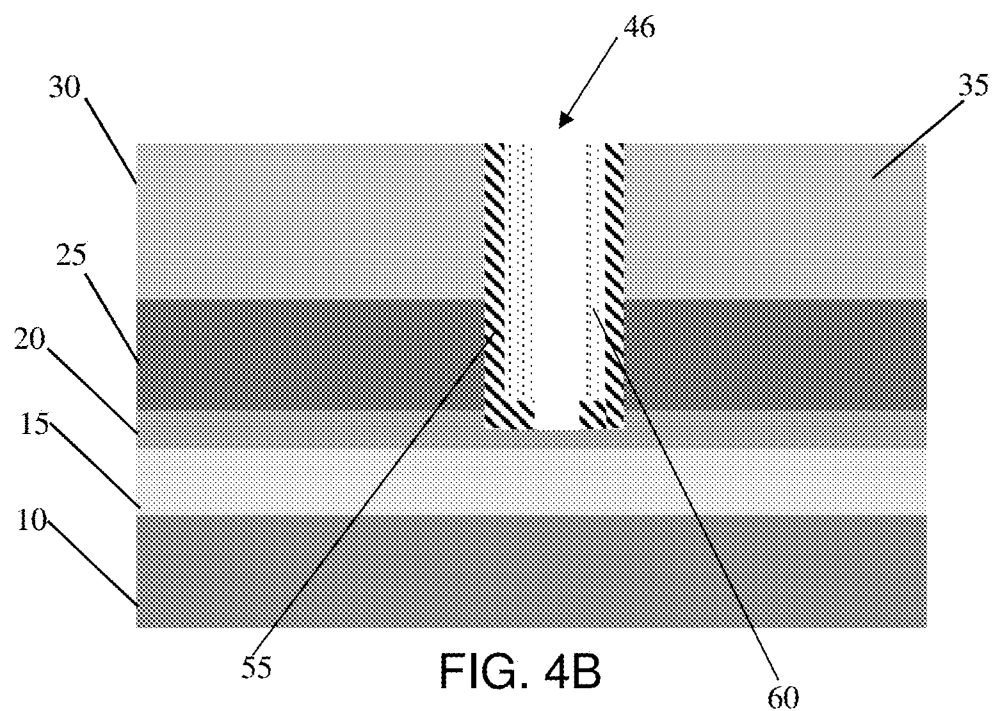

FIGS. 4A and 4B show removal of the spacer and barrier material on horizontal surfaces of the trenches 45, 46 and outside of the trenches 45, 46. In particular, the spacer 60 and barrier material 55 can be removed from a top surface of the material 30 and the bottom surface of the trenches 45, 46 by a conventional anisotropic process. The barrier material 55 and the spacer 60 will remain on sidewalls of the trenches 45, 46, providing an effective moisture barrier.

Figure 5:
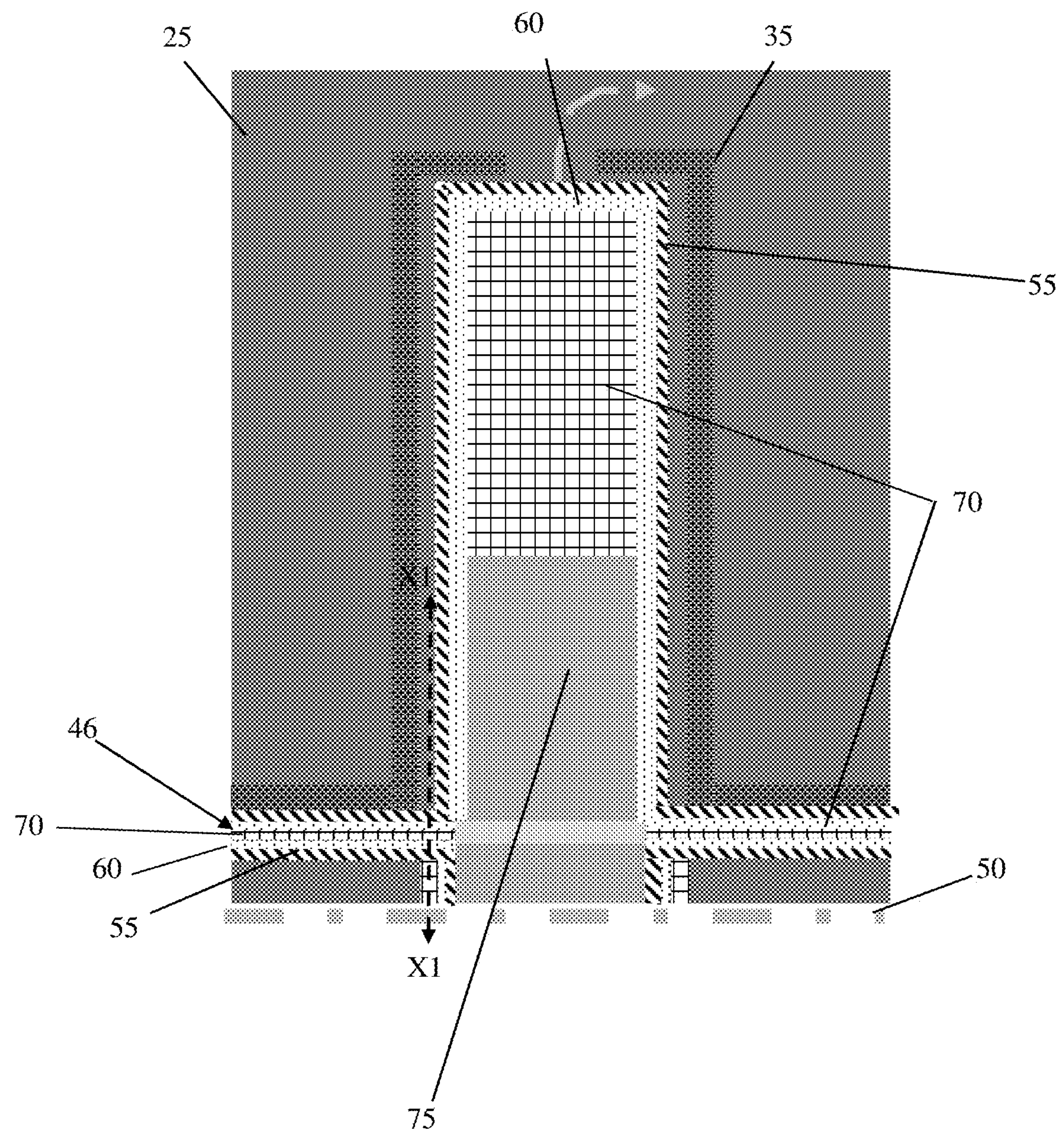
FIG. 5 shows a top view of TEOS on a stack etch perimeter, amongst other features, and respective fabrication processes in accordance with aspects of the present disclosure.

FIG. 5 shows a top view of the structure with a seal material in the trenches 45, 46 to prevent moisture ingress. More specifically, in FIG. 5, a low density TEOS 70 is deposited on the sidewalls of the trenches 45, 46. The low density TEOS 70 is formed over the barrier material 55 and spacer 60 on the sidewalls of the trenches 45, 46, in addition to the bottom surfaces thereof. In embodiments, the low density TEOS 70 will completely fill the trench 46. In this way, the low density TEOS 70, formed within the trenches 45, 46 can be used in combination with the barrier material 55 and the spacer 60. That is, using the low density TEOS 70 within the trenches, it is now possible to effectively provide a moisture barrier at the edge of the chip using the combination of the barrier material 55 and spacer 60 underneath TEOS, preventing of moisture from reaching the opening in the guard ring 35 surrounding the trench 45.

The low density TEOS 70 on the bottom the trench 45 will also form part of a groove 75 (e.g., V-groove) to accommodate a fiber optic cable which will extend light into the active area of the chip and, more specifically, to the waveguide structure through the opening in the guard ring as represented by the arrow of FIG. 5. In embodiments, the groove 75 can be fabricated in downstream processes as should already be understood by those of skill in the art such that no further explanation is required for an understanding of the invention.

The structures described herein can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also commonly used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:

a first trench in at least one substrate material;

a guard ring structure with an opening and which at least partially surrounds the first trench; and a second trench at a dicing edge of the at least one substrate material, the second trench being lined on sidewalls with a barrier material and spacer material over the barrier material, wherein the spacer material and the barrier material are moisture seal materials which line outer sidewalls of the first trench and the outer sidewalls of the second trench to prevent moisture ingress passing through an opening of the guard ring structure.

2. The structure of claim 1, wherein the barrier material is composed of alumina or nitride.

3. The structure of claim 1, wherein the spacer material is composed of oxide material.

4. The structure of claim 1, wherein the first trench intersects with the second trench, the first trench and the second trench includes the barrier material and the spacer material, and low density tetraethyl orthosilicate (TEOS) is provided over the spacer material.

5. The structure of claim 4, wherein the low density TEOS completely fills remaining portions of the second trench and partially fills the first trench.

6. The structure of claim 1, wherein the first trench is wider than the second trench.

7. The structure of claim 1, wherein the first trench and the second trench extend through one or more layers of insulator material.

8. The structure of claim 1, wherein the barrier material is composed of nitride or oxide on the outer sidewalls of the first trench and the second trench and the spacer material is composed of oxide directly on the barrier material.

9. The structure of claim 1, wherein the first trench intersects with the second trench at the dicing edge of the at least one substrate material.

10. The structure of claim 9, wherein the guard ring structure comprises a metal material that extends about an active region of a chip, and the chip includes a waveguide structure.

11. The structure of claim 10, wherein the first trench comprises a V-groove profile.

12. The structure of claim 11, wherein the waveguide structure comprises SiGe on an oxide layer.

13. A structure, comprising:

a groove formed within one or more layers of material and which extends from a perimeter of a chip;

a trench around the perimeter of a chip;

at least a first moisture barrier material lining sidewalls of the trench; and a spacer material lining the first moisture barrier material; and a material filling remaining portions of the trench, which is directly in contact with the spacer material, wherein the first moisture barrier material and the spacer material line outer sidewalls of the groove and the outer sidewalls of the trench to prevent moisture ingress from reaching an opening in a guard ring structure extending about the groove.

14. The structure of claim 13, wherein the first moisture barrier material is alumina or nitride.

15. The structure of claim 14, wherein the spacer material is an oxide.

16. The structure of claim 15, further comprising a low density oxide over the spacer material, which fills remaining portions of the trench and partially fills the groove.

17. The structure of claim 13, wherein the first moisture barrier material is nitride or alumina or oxide.

18. The structure of claim 17, wherein the groove is wider than the trench.

* * * * *